United States Patent [19]

Minagawa et al.

[11] Patent Number: 4,543,533
[45] Date of Patent: Sep. 24, 1985

[54] PARAMETRIC AMPLIFIER

[75] Inventors: Shoichi Minagawa; Takeshi Okamoto, both of Tokyo, Japan

[73] Assignee: Clarion Co., Ltd., Tokyo, Japan

[21] Appl. No.: 527,692

[22] Filed: Aug. 30, 1983

[30] Foreign Application Priority Data

Sep. 1, 1982 [JP] Japan .................. 57-153044
Sep. 1, 1982 [JP] Japan .................. 57-153045

[51] Int. Cl.⁴ .............................................. H03F 7/00
[52] U.S. Cl. ........................................ 330/5.5; 330/4.6
[58] Field of Search ................ 330/4.5, 4.6, 5, 5.5

[56] References Cited

U.S. PATENT DOCUMENTS 3,882,408  5/1975  Auld ...................................... 330/4.6
4,158,177  6/1979  Archambault ...................... 330/4.6

Primary Examiner—James B. Mullins
Assistant Examiner—G. Wan
Attorney, Agent, or Firm—Russell E. Hattis; Stephen R. Arnold

[57] ABSTRACT

The parametric amplifier includes plurality of parameter changing or exciting regions provided in a periodic array on a wave propagation medium having the property that waves having different frequencies travel through the medium at different velocities, so as to cause a parametric action only when a wave applied to the amplifier satisfies a predetermined condition relative to the dispersive nature of the medium.

3 Claims, 8 Drawing Figures

PARAMETRIC AMPLIFIER

FIELD OF THE INVENTION

This invention relates to a parametric amplifier profitably utilizing a nature of a medium that waves having different frequencies disaccord in their propagation speeds when they propagate through the medium.

BACKGROUND OF THE INVENTION

A parametric amplifier maybe used as a preamplifier, for example, in various transmission systems because of its capability of suppressing noise.

Such a parametric amplifier is generally of a lumped-constant diode type and requires another means, such as a circulator, for separation of input signals and idler signals. Further, since the amplifier is of a synchronizing type which requires complicated adjustment, it is difficult to design the amplifier to be variable in its amplification center frequency.

On the other hand, there has been proposed a travelling-wave parametric amplifier for the purpose of achieving a wider band amplification.

The basic system of the travelling-wave amplifier is to make a signal wave and a pumping wave concurrently travel through a non-linear medium to cause a parametric interaction therebetween, and to apply the energy of the pumping wave to both the signal wave and an idler wave which is newly generated, thus effecting signal amplification. To ensure this function, it is necessary to keep a constant phase correlation between the signal wave, the pumping wave and the idler wave; however, it is very difficult to satisfy this requirement.

This is generally caused by the phenomenom that the signal wave, pumping wave and idler wave travel at different speeds through the medium because their frequencies are different.

OBJECT OF THE INVENTION

It is therefore an object of the invention to provide a parametric amplifier capable of easily keeping a constant phase correlation between a signal wave, pumping wave and idler wave.

SUMMARY OF THE INVENTION

In accordance with the invention, the parametric amplifier includes parameter changing (excitation) regions formed along a major surface of a wave propagation medium at a specially determined interval so as to cause a parametric interaction only when the input wave motion satisfies a predetermined condition relative to the dispersive nature of a medium wherein waves having different frequencies do not have the same speeds through the medium.

DETAILED DESCRIPTION OF THE PREFERRED EMBODIMENTS

Figure 1:
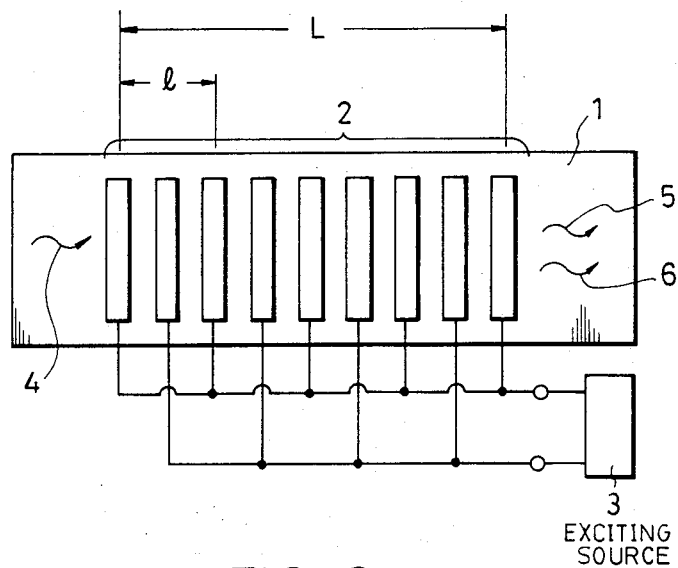
FIG. 1 is a schematic view of a parametric amplifier embodying the invention.

The invention will now be described in detail by way of preferred embodiments referring to the drawings.

FIG. 1 schematically show a parametric amplifier embodying the invention. A wave propagation medium 1 is made from a substance which causes the wave propagation speed to vary due to frequency variation. A parameter changing zone 2 comprises plural parameter changing (excitation) regions which are periodically aligned along a major surface of the medium 1 with a cycle length l. The wave propagation medium 1 changes in its parameters at the parameter changing regions when it is excited. Each region of the zone 2 is connected to an exciting source 3.

The "parameter" herein means a quantity to which a nature of a medium to affect wave propagation through the medium is assigned.

Reference numeral 4 refers to an input wave, 5 and 6 to output waves, and L to the length of the zone 2 where a parametric interaction occurs.

Figure 2:
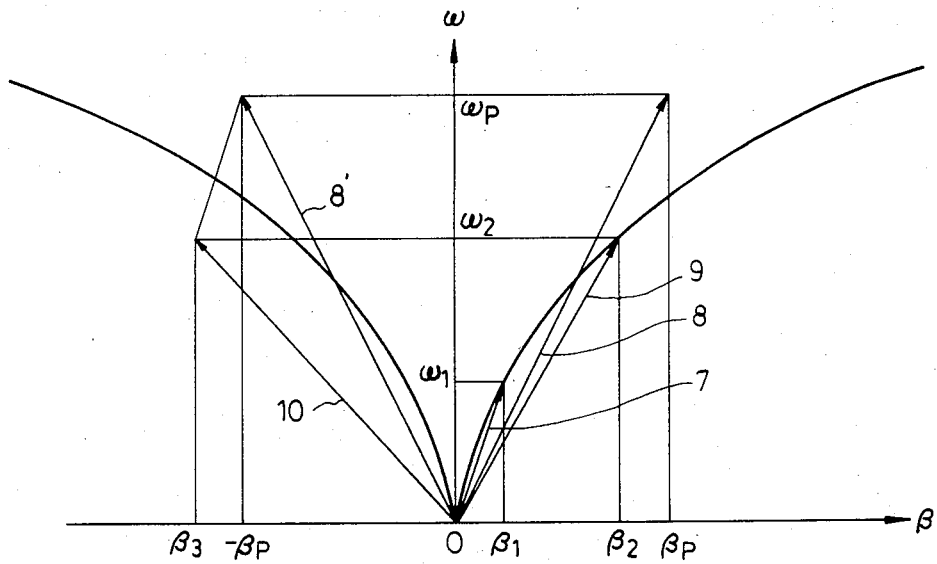
FIGS. 2 and 3 show propagation speed characteristic curves of waves which travel through a medium in the embodiment of FIG. 1.
Figure 3:
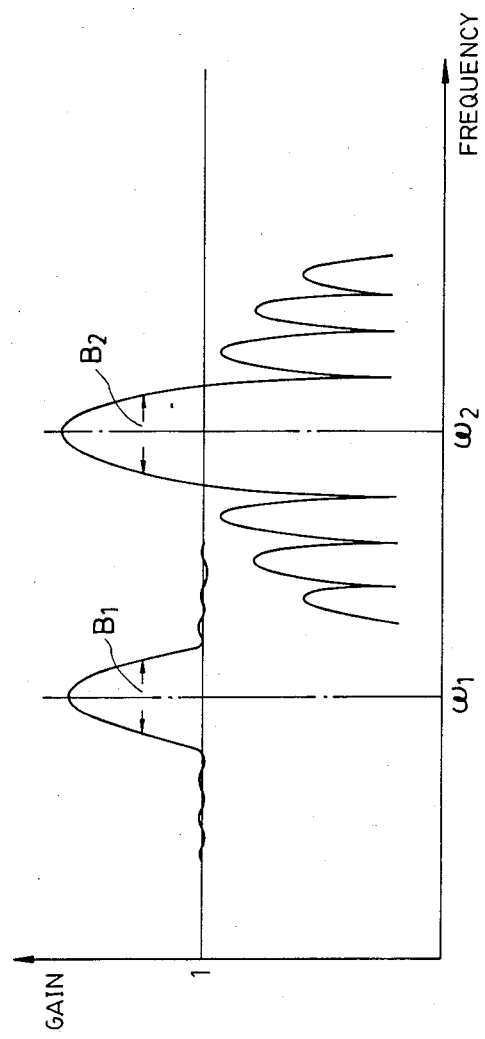

An example of the nature of the wave propagation medium 1 in respect to wave propagation speed variation according to frequency is shown by the curves of FIG. 2 in which the abscissa is the wave number $\beta$ and the ordinate is the angular frequency $\omega$ (angular velocity$=2\pi f$).

As an input wave 4 passes through the parameter changing (excitation) zone 2, it takes on energy from the exciting source 3 due to the parametric interaction, thereby increasing its amplitude and concurrently producing a new idler wave.

To cause such a parametric interaction in accordance with the invention, it is necessary to satisfy the following equations when $\omega_1$ is the angular frequency of the input wave, $\beta_1$ is the input wave number, $\omega_2$ is the angular frequency of the idler wave, $\beta_2$ is the idler wave number, and $\omega_p$ is the excitation (pump) angular frequency of the exciting source 3:

$$\omega_p = \omega_1 + \omega_2 \qquad (1)$$

$$\beta_p \approx \beta_1 + \beta_2 \ (\beta_p = 2\pi/l) \qquad (2)$$

It is also required that the wave number $\beta_2$ and the angular frequency $\omega_2$ of the idler wave be positioned on the curves of FIG. 2.

In FIG. 2, reference numerals 7 refers to a wave vector of the input wave 4, 8 and 8' to wave vectors of the excited waves, 9 to a wave vector of the idler wave, and 10 to a wave vector of a wave which is expected to result from a parametric interaction between the wave vectors 7 and 8.

If an input wave does not satisfy the above-mentioned conditions, no parametric interaction is caused by the propagation. For example, although there is a component corresponding to the wave vector 8' in FIG. 2, the wave vector 10 which is a composition of the wave vector 8' and the input wave vector 7 does not satisfy the conditions for wave propagation (the wave vector 10 is not on the curve of FIG. 2). Therefore, the wave vector 10 does not grow into a wave.

This means that the amplifier only amplifies selected frequency waves because only the wave satisfying the above-mentioned conditions for wave propagation can travel through the medium 1.

When the wave propagation losss is small in FIG. 1, amplification gains $G_1$ and $G_2$ ($G_1$: gain of signal wave component, $G_2$: gain of idler wave component) at the center frequency of the amplification band are expressed by:

$$G_1 \propto \cosh^2 \frac{\sqrt{\beta_1 \beta_2 \epsilon_1 \epsilon_2}}{8} L \qquad (3)$$

$$G_2 \propto \frac{\beta_2 \epsilon_2}{\beta_1 \epsilon_1} \sinh^2 \frac{\sqrt{\beta_1 \beta_2 \epsilon_1 \epsilon_2}}{8} L \qquad (4)$$

($\epsilon_1$ and $\epsilon_2$ are amounts of parameter changes due to excitation for the signals $\omega_1$ and $\omega_2$, respectively, Cosh is the hyperbolic cosine, and Sinh is the hyperbolic sine.)

The expressions (3) and (4) show that the following measures are effective to increase the gains $G_1$ and $G_2$:
1. increasing the length L of the parametric interaction zone 2;
2. increasing the amounts $\epsilon_1$ and $\epsilon_2$ of the parameter changes due to the excitation (enforcing the excitation); and
3. increasing the signal processing frequencies ($\beta_1$ and $\beta_2$).

When the exciting frequency $\omega_{92}$ (pumping frequency) of the exciting source 3 is fixed, the amplification gains depend on the frequency so that the amplifier amplifies waves which travel within two frequency bands having center frequencies $\omega_1$ and $\omega_2$ and having band widths $B_1$ and $B_2$, respectively. The band widths $B_1$ and $B_2$ vary depending upon the amount of wave speed divergence, the input signal frequency, the power of excitation, the length L of the parametric interaction zone 2, and other factors. So, the band widths $B_1$ and $B_2$ may be selected as desired.

Figure 4:
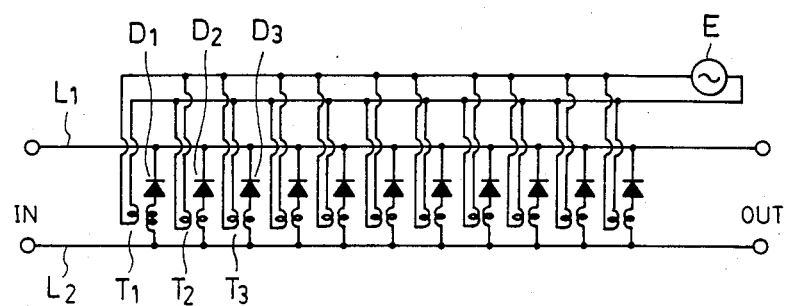
FIG. 4 shows an example of a circuit connection of the embodiment of FIG. 1.

FIG. 4 shows a circuit connection of the parametric amplifier. Reference numerals $L_1$ and $L_2$ designate strip lines, IN is a signal input terminal, OUT is an output terminal for signal and idler wave outputs, $T_1, T_2, T_3$ . . . are coupling transformers, $D_1, D_2, D_3$ . . . are variable capacity diodes, and E is an excitation power source.

Figure 5:
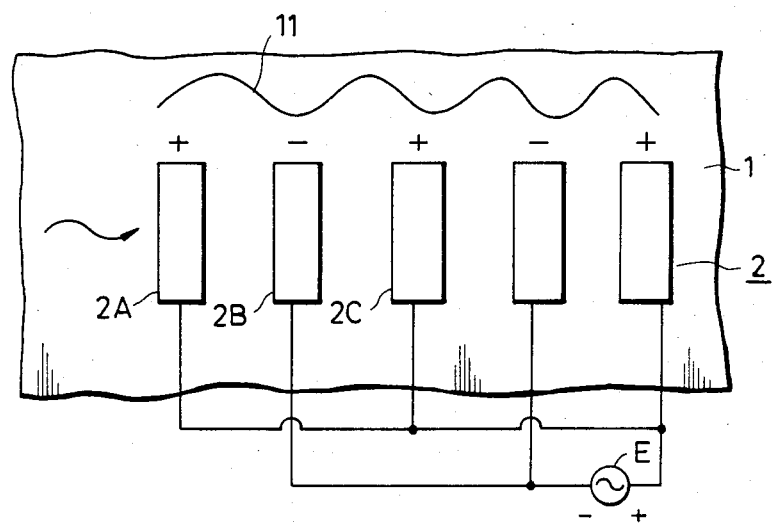
FIG. 5 is a schematic view of the amplifier to show its operation.

FIG. 5 shows how the parametric amplifier operates. The respective ones of the parameter changing regions 2A, 2B, 2C . . . provided on the wave propagation medium 1 vary the parameters at a determined time lag so that the overall zone 2 performs periodic, positional parameter changes as shown by a wave 11.

Figure 6:
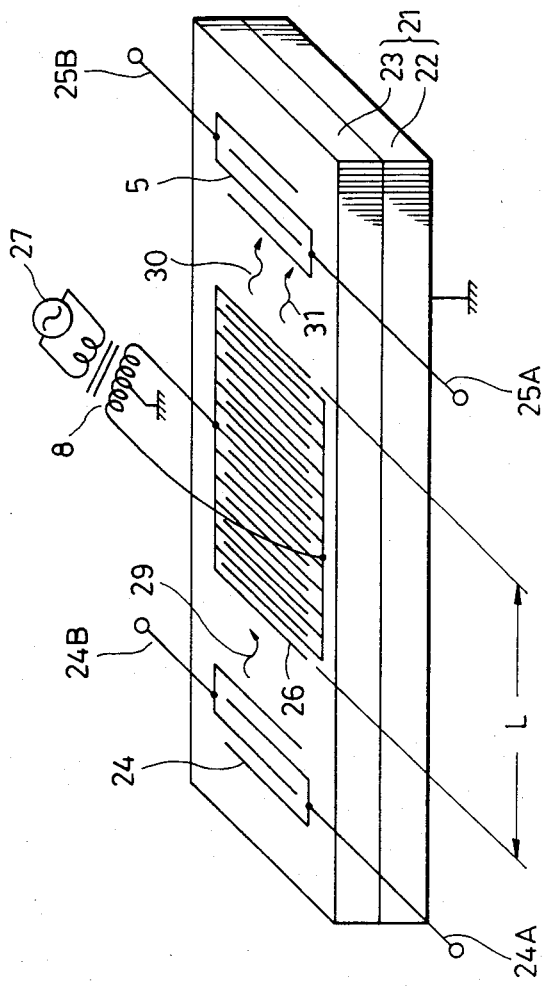
FIGS. 6 and 7 are schematic views of further amplifiers also embodying the invention.

FIG. 6 shows a parametric surface-acoustic-wave amplifier employing the theory of the invention. The medium 21 comprises a lamination of a semiconductive wafer 22 and a piezoelectric substance 23 deposited on the wafer 22. An input transducer 24 includes signal input terminals 24A and 24B. An output transducer 25 includes signal output terminals 25A and 25B. A pumping electrode structure 26 is an interdigitated electrode structure provided between the input and output transducers 24 and 25. Reference numeral 27 refers to a pumping power source, 28 to a balance/unbalance transformer, 29 to an input surface acoustic wave, and 30 and 31 to output surface acoustic waves.

Figure 7:
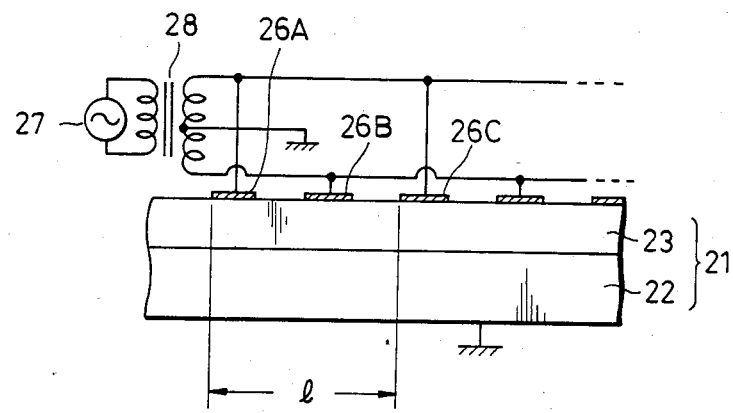

FIG. 7 shows a structure of the pumping electrode structure 26. The electrode structure 26 consists of a number of electrode fingers 26A, 26B, 26C . . . which are parallel aligned and have a cycle length (alternate finger spacing) l.

The semiconductor wafer 22 may be made from silicon, gallium arsenic or the like and carries thereon the piezoelectric substance 23 which is made by depositing molecules of zinc oxide (ZnO), aluminum nitride (AlO), lithium niobate (LiNbO$_3$), cadmium sulfide (CdS), zinc sulfide (ZnS) or the like by a known vapour deposition, sputtering or CVD methods, for example. Desired metal molecules are deposited on the piezoelectric layer 23 by a known vapour deposition method to form a metal film, and the metal film is selectively removed by the photolithographic method so that the remainder makes the input and output transducers 24 and 25 and the pumping electrodes 26.

The input and output transducers 24 and 25 are thereafter provided with the signal input terminals 24A and 24B and the signal output terminals 25A and 25B, respectively, by the wire bonding method, for example, so that a signal applied to the input terminals 24A and 24B distorts the piezoelectric substance 23 so as to generate surface acoustic waves and convey them rightward toward the pumping electrode 26.

Since the medium 21 is a lamination, propagation speeds of surface acoustic waves travelling along the surface thereof differ in accordance with their frequencies.

For example, if the upper most layer is thicker than the wavelength of a surface acoustic wave, the largest part of the energy of the surface acoustic wave is converted within the uppermost layer. Therefore, the travelling speed approaches the value determined by various coefficients of the uppermost layer relevant to wave propagation. On the other hand, if the uppermost layer is much thinner than the wavelength, the propagation speed is determined by the nature of the base wafer.

Figure 8:
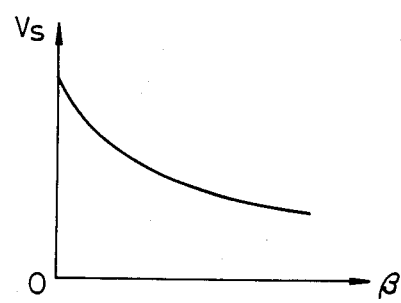
FIG. 8 shows a propagation speed characteristic of a surface acoustic wave.

When the base semiconductive wafer 22 is made from silicon and the piezoelectric layer 23 is made from zinc oxide (ZnO), surface acoustic waves travel faster through the silicon and slower through the zinc oxide, so that the relation between the wave number $\beta (\equiv 2\pi/\lambda, \lambda$: wavelength of a surface acoustic wave) and the surface acoustic wave propagation velocity Vs becomes as shown in FIG. 8 when the thickness of the zinc oxide is fixed.

The surface acoustic waves 30 and 31 are provided with energy from the pumping power source 27 and are amplified due to the parametric interaction. The amplified waves travel through the medium, and are converted into electric signals by the output transducer 25. The electric signals are then outputted from the terminals 25A and 25B.

This shows that the amplifier amplifies a signal whose angular frequency is $\omega_1$ and outputs an amplified signal with the angular frequency $\omega_2$ and another signal whose angular frequency was converted into $\omega_2$. Since these signals are different in their frequencies, they may be easily separated by use of a filter connected to the amplifier. Alternatively, the transducer may be configured adequately so as to effect filtering function to output only a signal having a determined frequency.

A conventional parametric surface acoustic wave amplifier for signal amplification by propagating a signal wave and an idler wave in by same direction has the drawback that if the wave propagation medium exhibits a difference in surface acoustic wave travelling speeds due to a difference between the frequencies of the waves, the amplification effect decreases because a phase lag is produced between a pumping wave, signal wave and idler wave. However, the pumping method (excitation method) disclosed by the embodiment assures a sufficient amplification even if such a medium is employed.

The amplifier may have a frequency selecting characteristic so as to allow waves to pass through the medium only when the waves satisfy a specified condition. Therefore, it is possible to design the amplifier to serve as a tuning circuit to be employed in a high frequency amplifying circuit of a radio, wireless device, etc.

Since the signal wave and the idler wave may be different in their frequencies, it is easy to separate or detect them by use of a simple frequency filter. If the transducer itself is given such a filtering nature, no independent outer filter is necessary.

The invention basically allows one to make the wave propagation medium from any solid, liquid or gaseous substance provided it produces wave propagation speed difference due to a frequency difference, and allows the use of surface acoustic wave, magnetostatic wave, electromagnetic wave, electron-beam wave, or the like. Various combinations of the medium materials, the waves and the periodic, parametric excitation can effect the above-described performance of the parametric amplifier.

As described in the above, the amplifier of the invention employs a wave propagation medium which produces a wave speed difference due to a frequency difference, and includes parameter changing portions periodically provided on the medium for changing the parameters upon excitation of the medium, so as to cause a parametric interaction and allow a wave to travel through the medium only when the wave satisfies the specified condition in respect to the wave frequency/speed difference characteristic. Therefore, the invention profitably utilizes such wave frequency/speed difference characteristic of the medium, and alleviates the drawbacks involved in the prior art.

Although it has up to now been difficult to employ such a wave speed difference producing medium in a travelling-wave parametric amplifier, the present invention makes it possible. Therefore, the invention allows a relatively free design of the amplification band width and extends to the possible employment of various materials.

Since the amplification center frequency may be varied by changes of the excitation frequency, the amplifier may involve a signal tuning function and an undesired frequency excluding function. Beside this, since the amplifier is of a travelling wave type, it is easy to separate the signal wave and the idler wave. Thus, it is not necessary to use an additional device such as a circulator.

The invention provides the travelling-wave amplifier also having a variable tuning function while it maintains the advantages of the prior art.

We claim:

1. A parametric surface-acoustic-wave amplifier which comprises:
   a surface acoustic wave propagation medium having a nature to produce a different between travelling velocities of surface acoustic waves having different frequencies and travelling therethrough;
   an input transducer provided on said medium to convert an input electric signal into a surface acoustic wave;
   an output transducer provided on said medium to convert said surface acoustic wave into an output electric signal;
   exciting means provided between said input and output transducers on said medium to give a parametric interaction to said surface acoustic wave supplied from said input transducer; and
   power source means to apply a pumping power to said exciting means,
   said exciting means including a plurality of parameter changing regions disposed in a periodic alignment having a cycle length l to change a parameter of said medium in response to said pumping power applied thereto, said cycle length being chosen such that for an angular signal input frequency $\omega$, equal to the sum of the frequency $\omega_s$ of the exciting source and the frequency $\omega_2$ of the idler wave motion resulting from said parametric interaction, said cycle length of said parameter changing regions is related to the wave numbers $\beta_1$ and $\beta_2$ in said medium corresponding to the frequencies $\omega_1$ and $\omega_2$ respectively by the approximate relationship $2\pi/l \approx \beta_1 + \beta_2$.

2. A parametric surface-acoustic-wave amplifier as set forth in claim 1 wherein said medium is a lamination of a piezoelectric substance and a semiconductive substance.

3. A parametric surface-acoustic-wave amplifier as set forth in claim 1 wherein said exciting means include a pumping electrode structure comprising plural finger electrodes interdigitating with each other.

* * * * *